United States Patent
Lo

(10) Patent No.: US 7,794,529 B2
(45) Date of Patent: Sep. 14, 2010

(54) AIR FILTERING SYSTEM

(75) Inventor: Huan-Liang Lo, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 363 days.

(21) Appl. No.: 11/967,015

(22) Filed: Dec. 29, 2007

(65) Prior Publication Data

US 2009/0078122 A1    Mar. 26, 2009

(30) Foreign Application Priority Data

Sep. 26, 2007    (CN) .................. 2007 1 0201857

(51) Int. Cl.
*B01D 46/00* (2006.01)

(52) U.S. Cl. .............. 96/420; 55/354; 55/385.6; 96/429

(58) Field of Classification Search ............... 55/317, 55/328, 385.1, 400, 475, 495, 385.6, 354, 55/285; 96/420, 429, 397, 401, 407; 95/14; 210/160, 359, 400, 526, 783

See application file for complete search history.

(56) References Cited

U.S. PATENT DOCUMENTS

| | | | | |
|---|---|---|---|---|
| 3,121,812 A | * | 2/1964 | MacArthur ............... 310/49.49 |
| 4,969,598 A | * | 11/1990 | Garris ..................... 236/12.12 |
| 5,539,672 A | * | 7/1996 | Mullin et al. ............... 700/299 |
| 5,560,835 A | * | 10/1996 | Williams .................... 210/783 |
| 5,599,363 A | * | 2/1997 | Percy ......................... 55/352 |
| 5,899,570 A | * | 5/1999 | Darmawaskita et al. ..... 374/170 |
| 6,040,777 A | | 3/2000 | Ammann et al. |
| 6,152,998 A | * | 11/2000 | Taylor ........................ 96/429 |
| 6,168,646 B1 | * | 1/2001 | Craig et al. .................... 95/14 |
| 6,596,059 B1 | * | 7/2003 | Greist et al. ................. 96/417 |
| 6,632,269 B1 | * | 10/2003 | Najm ......................... 95/273 |
| 6,743,282 B2 | * | 6/2004 | Najm ......................... 96/429 |
| 6,811,685 B2 | * | 11/2004 | Wanni et al. ................. 210/97 |
| 6,843,834 B2 | * | 1/2005 | Schumacher ................ 95/277 |
| 7,186,290 B2 | * | 3/2007 | Sheehan et al. ............... 95/277 |
| 7,608,121 B2 | * | 10/2009 | Boyer et al. ............... 55/282.2 |

(Continued)

FOREIGN PATENT DOCUMENTS

CN    1548829 A    11/2004

(Continued)

*Primary Examiner*—Duane Smith
*Assistant Examiner*—Thomas Bennett McKenzie
(74) *Attorney, Agent, or Firm*—Jeffrey T. Knapp

(57) ABSTRACT

An exemplary air filtering system is for filtering air passing through a ventilating opening of an electronic device casing. The air filtering system includes an air filtering unit, an actuating unit, and a monitoring and controlling unit. The air filtering unit includes a flexible air filtering mesh, a driving shaft and a following shaft. The driving and following shaft are rotatably positioned at opposite sides of the ventilating opening. The air filtering mesh is wrapped around the driving and following shafts with opposite ends thereof positioned to the driving and following shaft respectively. A portion of the air filtering mesh between the driving and following shafts covers the ventilating opening. The actuating unit is connected to the driving shaft of the filtering unit. The monitoring and controlling unit is configured to monitor a temperature in the electronic device casing and control the actuating unit according to the temperature.

6 Claims, 1 Drawing Sheet

U.S. PATENT DOCUMENTS

2008/0283220 A1* 11/2008 Martin et al. ............... 165/95
2009/0113857 A1* 5/2009 Sithes ......................... 55/293
2009/0288655 A1* 11/2009 Tsai ........................ 126/299 R

FOREIGN PATENT DOCUMENTS

| | | |
|---|---|---|
| CN | 1920893 A | 2/2007 |
| JP | 8152242 A | 6/1996 |
| TW | 233787 | 11/1994 |
| TW | 363451 | 7/1999 |
| TW | 200734795 | 9/2007 |

* cited by examiner

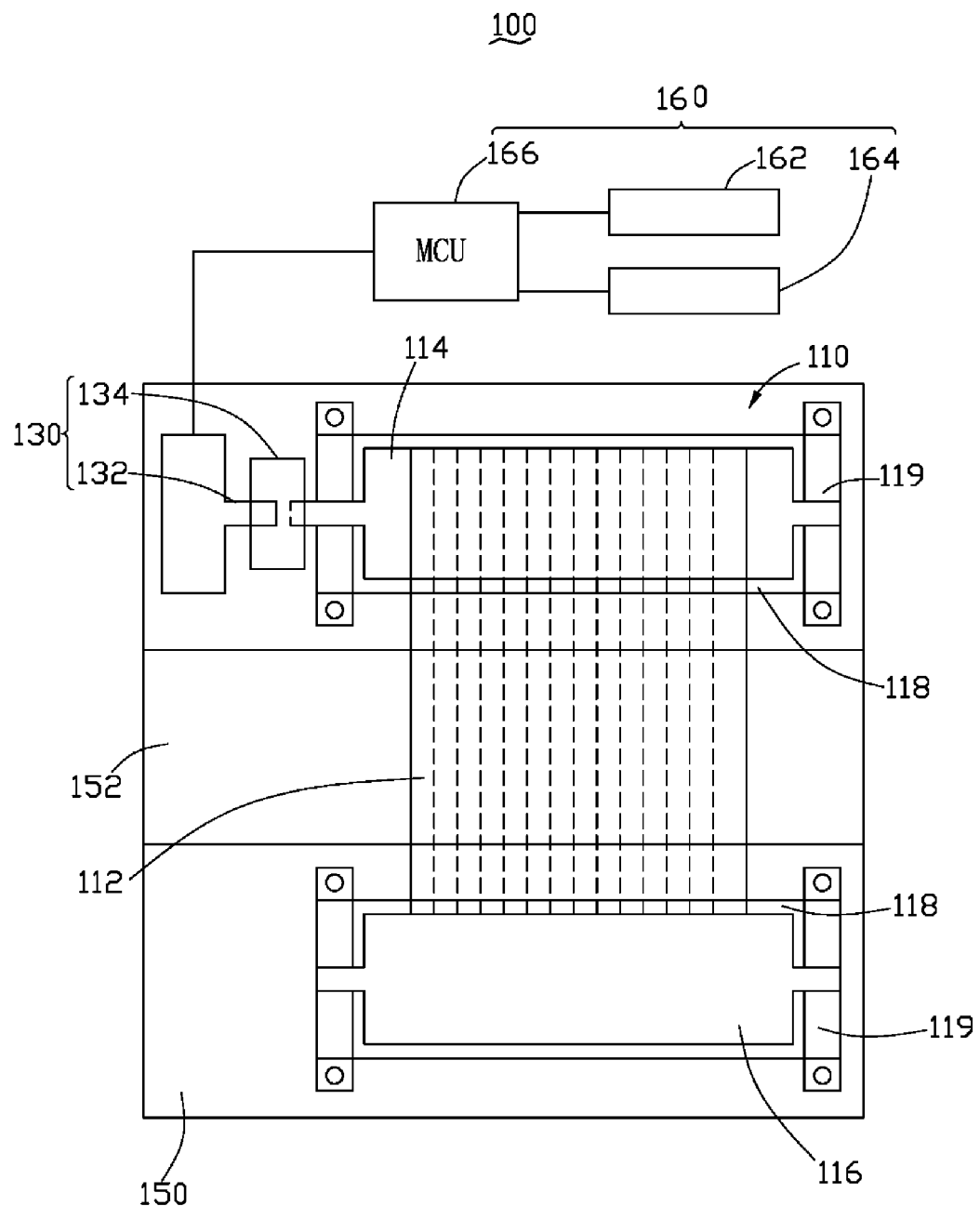

AIR FILTERING SYSTEM

BACKGROUND

1. Technical Field

The present invention relates to air filtering systems and, particularly, to an air filtering system used in an electronic device.

2. Description of Related Art

Many current electronic devices need to be ventilated for dissipating heat. However, dust and the like enter the electronic devices along with air and contaminate electronic components in the electronic devices. An air filter is thereby positioned at an air inlet of an electronic device for filtering dust from the air. The dust accumulated on the air filter, hinders cooling air from flowing into the electronic device. Timely replacement of the air filter is required. Unfortunately, users may forget to replace the air filter.

What is needed, therefore, is an air filtering system which can automatically replace an air filter at a ventilating opening.

SUMMARY

In accordance with a present embodiment, air filtering system is for filtering air passing through a ventilating opening of an electronic device casing. The air filtering system includes an air filtering unit, an actuating unit, and a monitoring and controlling unit. The air filtering unit includes a flexible air filtering mesh, a driving shaft and a following shaft. The driving and following shaft are rotatably positioned at opposite sides of the ventilating opening. The air filtering mesh is wrapped around the driving and following shafts with opposite ends thereof positioned to the driving and following shaft respectively. A portion of the air filtering mesh between the driving and following shafts covers the ventilating opening. The actuating unit is connected to the driving shaft of the filtering unit. The monitoring and controlling unit is configured to monitor a temperature in the casing and control the actuating unit according to the temperature.

Other advantages and novel features will be drawn from the following detailed description of at least one preferred embodiment, when considered in conjunction with the attached drawings.

BRIEF DESCRIPTION OF THE DRAWING

Many aspects of the present air filtering system can be better understood with reference to the following drawing. The components in the drawing are not necessarily drawn to scale, the emphasis instead being placed upon clearly illustrating the principles of the present air filtering system. Moreover, in the drawing, like reference numerals designate corresponding parts throughout the several views.

The FIGURE is a plan view of an air filtering system, according to a present embodiment.

DETAILED DESCRIPTION OF THE EMBODIMENTS

Embodiments of the present air filtering system will now be described in detail below and with reference to the drawing.

Referring to the FIGURE, an air filtering system 100 according to a present embodiment is shown. The air filtering system 100 is secured to a casing 150 of an electronic device (not shown). The casing 150 defines a ventilating opening 152 for allowing cooling air to enter the casing 150. The air filtering system 100 comprises a filtering unit 110, an actuating unit 130, and a monitoring and controlling unit 160. The filtering unit 110 is secured to the casing 150 for filtering air passing into the casing 150 via the ventilating opening 152. The actuating unit 130 is configured to actuate the filtering unit 110. The monitoring and controlling unit 160 is positioned into the casing 150 and configured to monitor temperature within the casing or of a core electronic component (not shown) within the casing and control the actuating unit 130.

The filtering unit 110 comprises a flexible air filtering mesh 112, a driving shaft 114, a following shaft 116, and two carriers 118. Opposite ends of the air filtering mesh 112 are respectively positioned to the driving shaft 114 and the following shaft 116. A starting portion and any used portion of the air filtering mesh 112 is wrapped around the driving shaft 114 and any unused portion of the flexible air filtering mesh 112 is wrapped around the following shaft 116. The carriers 118 are disposed at opposite sides of the ventilating opening 152, with a portion of the unused air filtering mesh 112 unwrapped from the following shaft 116 to cover the ventilating opening 152. Each carrier 118 is a hollow shell and comprises two supports 119 at opposite ends of the carrier 118. The supports 119 support opposite ends (not labeled) of the driving shaft 114 and the following shaft 116, and facilitate installation of the carriers 118 to the casing 150. The driving shaft 114 and the following shaft 116 as well as the air filtering mesh 112 wrapped thereon are rotatably received in the carriers 118, respectively. A portion of the flexible air filtering mesh 112 between the driving shaft 114 and the following shaft 116 covers the ventilating opening 152 for filtering air passing through the ventilating opening 152.

The actuating unit 130 comprises a rotary shaft 132 and a coupling 134. The rotary shaft 132 is driven by the monitoring and controlling unit 160. The coupling 134 is configured to connect the driven shaft 114 to the rotary shaft 132 and transmit power of the rotary shaft 132 to the driven shaft 114.

The monitoring and controlling unit 160 comprises a temperature monitor 162, and a micro-processing unit (MCU) 166. The temperature monitor 162 is connected to the MCU 166 and configured to monitor the temperature within the casing 150 or of the core electronic component within the casing 150. The MCU 166 is configured to control the actuating unit 130 according to the monitored temperature. The temperature monitor 162 reports a current temperature to the MCU 166, if the current temperature is higher than a predetermined temperature, the MCU 166 starts the actuating unit 130. The rotary shaft 132 of the actuating unit 130 thereby rotates, and the driving shaft 114 rotates along with a rotation of the rotary shaft 132. The dirty air filtering mesh 112 at the ventilating opening 152 is automatically rolled onto the driving shaft 114, and unused air filtering mesh 112 wrapped on the following shaft 116 is automatically drawn out to replace the dirty air filtering mesh 112.

In the embodiment, the monitoring and controlling unit 160 further comprises a timer 164 connected to the MCU 166. The timer 164 is initialized when an unused air filtering mesh 112 is arranged at the ventilating opening 152 of the casing 150. The timer 164 is configured to control the MCU 166 to read the current temperature from the temperature monitor 162 at uniform or changing intervals. Changing intervals are useful in that, the newer the air filtering mesh 112 the longer the interval may be, and the older the air filtering mesh 112 the shorter the interval may be. In this embodiment, the actuating unit 130 remains active until a new current temperature is below the predetermined temperature. The rotary shaft 132 of the actuating unit 130 thereby rotates, and the driving shaft 114 rotates along with a rotation of the rotary shaft 132. The dirty air filtering mesh 112 at the ventilating opening 152 is automatically rolled onto the driving shaft 114, and the unused air filtering mesh 112 wrapped on the following shaft 116 is automatically drawn out to cover the ventilating opening 152. The timer 164 is then re-initialized and resumes timing.

It will be understood that the above particular embodiments and methods are shown and described by way of illustration only. The principles and features of the present invention may be employed in various and numerous embodiments thereof without departing from the scope of the invention as claimed. The above-described embodiments illustrate the scope of the invention but do not restrict the scope of the invention.

What is claimed is:

1. An air filtering system for filtering air passing through a ventilating opening of an electronic device casing, the air filtering system comprising:

an air filtering unit comprising a flexible air filtering mesh, a driving shaft, and a following shaft, the driving shaft and the following shaft configured for being rotatable positioned at opposite sides of the ventilating opening, the air filtering mesh being wrapped around the driving shaft and the following shaft with opposite ends thereof positioned to the driving shaft and the following shaft respectively, a portion of the air filtering mesh between the driving shaft and the following shaft configured for covering the ventilating opening;

an actuating unit connected to the driving shaft of the filtering unit; and a monitoring and controlling unit comprising:

a temperature monitor configured to monitor a temperature in the electronic device casing;

a micro-processing unit; and a timer configured to control the micro-processing unit to read a current temperature from the temperature monitor at intervals, the micro-processing unit being configured to control the actuating unit according to the read current temperature, wherein the timer is configured for controlling the micro-processing unit to read a current temperature from the temperature monitor at intervals in a manner that the newer the air filtering mesh, the longer the interval, and the older the air filtering mesh, the shorter the interval.

2. The air filtering system as claimed in claim 1, wherein the filtering unit comprises two carriers disposed at opposite sides of the ventilating opening, the carriers being configured to receive the driving shaft and the following shaft.

3. The air filtering system as claimed in claim 2, wherein each carrier is a hollow shell and comprises two supports at opposite ends thereof, and wherein opposite ends of the driving shaft and the following shaft are rotatably supported on the supports of the corresponding carrier.

4. The air filtering system as claimed in claim 3, wherein the supports are configured to facilitate installation of the carriers to the electronic device casing.

5. The air filtering system as claimed in claim 1, wherein the timer is re-initialized and resumes timing after an unused portion of the air filtering mesh replaces the used portion of the air filtering mesh covering the ventilating opening.

6. The air filtering system as claimed in claim 1, wherein the actuating unit comprises a rotary shaft and a coupling connecting the rotary shaft to the driving shaft of the air filtering unit so that the driving shaft rotates along with a rotation of the rotary shaft.

* * * * *